United States Patent
Tanabe et al.

(10) Patent No.: US 7,108,515 B2
(45) Date of Patent: Sep. 19, 2006

(54) WIRING BOARD WITH BENDING SECTION

(75) Inventors: Koji Tanabe, Katano (JP); Shoji Fujii, Osaka (JP); Yosuke Chikahisa, Akashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/039,876

(22) Filed: Jan. 24, 2005

(65) Prior Publication Data

US 2005/0191872 A1  Sep. 1, 2005

(30) Foreign Application Priority Data

Feb. 26, 2004  (JP) ............................. 2004-051085
Apr. 2, 2004   (JP) ............................. 2004-109787

(51) Int. Cl.
  *H01R 12/00* (2006.01)
(52) U.S. Cl. ........................................ 439/67; 349/150
(58) Field of Classification Search ................. 439/67, 439/77; 349/150
  See application file for complete search history.

(56) References Cited

U.S. PATENT DOCUMENTS

| | | | | |
|---|---|---|---|---|
| 3,805,213 A | * | 4/1974 | Austin | 439/77 |
| 4,561,709 A | * | 12/1985 | Fukukura | 439/77 |
| 5,134,252 A | * | 7/1992 | Himeno et al. | 174/268 |
| 6,304,251 B1 | | 10/2001 | Ito et al. | |

FOREIGN PATENT DOCUMENTS

JP  2003-108302 A  4/2003

\* cited by examiner

*Primary Examiner*—Neil Abrams
(74) *Attorney, Agent, or Firm*—McDermott Will & Emery LLP

(57) ABSTRACT

A wiring substrate to be used in a variety of electronic apparatuses, and an input device, such as an optically transparent touch panel, using the same wiring substrate, and a method of manufacturing the same input device are disclosed. The invention simplifies a construction of the wiring substrate, reduces the number of manufacturing steps of the substrate, and makes all the connectors of the substrate in a single-sheet structure. The electrical and mechanical connections of those connectors to other connecting means can be thus highly reliable. Plural wiring patterns 22, 23, 24 and 25, and connectors 22A, 23A, 24A and 25A are formed on a first principal surface of wiring substrate 20. Substrate 20 includes flexible bending section P—P, and when substrate 20 is bend along bending section P—P, some connectors such as 24A, 25A are placed on a second principal surface opposite to the first one, so that wiring substrate 20 is formed.

9 Claims, 8 Drawing Sheets

WIRING BOARD WITH BENDING SECTION

FIELD OF THE INVENTION

The present invention relates to a wiring substrate, an input device such as an optically transparent touch panel using the same wiring substrate, and a method of manufacturing the same input devices.

BACKGROUND OF THE INVENTION

In recent years, electronic apparatuses have been sophisticated and diversified. This market trend is accompanied by an increment of electronic apparatuses equipped with an input device such as an optically transparent touch panel on the front face of a display element such as a liquid crystal display (LCD). A user recognizes and selects, via this input device, texts, marks, or symbols shown on the display element, thereby switching the functions of the electronic apparatus.

In the description hereinafter, position-relating terms such as "top surface", "underside", "right side", and "left side" are used. Those terms express a relative relation about positions of elements or sections when the drawings are viewed from the front, and they do not indicate an absolute relation about the positions.

In the description hereinafter, phrases such as "a first principal surface", and "a second principal surface" are used. The "first principal face" does not always mean a front face of elements such as a wiring substrate, and the "second principal surface" does not always mean a back face thereof In other words, an opposite side of the first principal surface is the second principal surface.

A conventional input device is described hereinafter with reference to FIG. 7–FIG. 9.

FIG. 7 shows a perspective view of a conventional optically transparent touch panel(hereinafter referred to as touch panel), and FIG. 8 shows a perspective view of an essential part of a wiring substrate employed in the touch panel shown in FIG. 1. The upper panel 1 is made from polyethylene terephthalate or polycarbonate film. Optically transparent upper panel 1 has optically transparent upper conductive layer 2 on its whole surface or a selective surface area. Conductive layer 2 is made from indium oxide or tin oxide, and formed on the surface by spattering.

A pair of upper electrodes 3, 4 formed by printing paste such as silver or carbon on upper panel 1 at which the base of upper conductive layer 2 is exposed in a given pattern by etching or laser-cutting. A pair of leaders 3A, 4A are prepared at the ends of upper electrodes 3, 4 respectively.

Lower panel 5 made from glass, acrylic, or poly-carbonate resin includes lower conductive layer 6 of optically transparent and similar to upper conductive layer 2 on its entire area of a principle surface or a selective area thereof. A pair of lower electrodes 7, 8 are formed on lower panel 5 from which lower electrode layer 6 has been removed.

Lower electrodes 7, 8 have a pair of lower leaders 7A, 8A at their ends respectively. Lower conductive layer 6 has plural dot-spacers (not shown) at its given places for maintaining a given space between upper conductive layer 2 and lower conductive layer 6. The dot spacers are formed at given intervals and made from insulating resin such as epoxy or silicon.

Upper and lower panels 1 and 2 are bonded at their circumferences with frame-like spacer 9 having adhesive applied to its upper and lower faces so that upper and lower conductive layers 2, 6 can oppose to each other with a given space maintained. Between the leaders of upper and lower panels 1 and 5, flexible wiring substrate 10, having plural wiring patterns and connectors formed on both the surfaces of substrate 10, is inserted to be held.

As shown in FIG. 8, wiring substrate 10 has a narrower section and a wider section. On a first principal surface of the narrower section, plural wiring patterns 12, 13, 14 and 15 are formed, and on the wider section of substrate 10, connectors 12A, 13A, 14B and 15B are formed independently. Wiring patterns 12 and 13 are coupled to connectors 12A and 13A respectively at their ends.

Wiring patterns 14 and 15 are coupled to wiring patterns formed on a second principal surface of wiring substrate 10 via through-holes 14A, 15A filled with conductive agent. Connectors 14B, 15B are formed on a wider section of the second principal surface independently.

FIG. 9 shows a sectional view of wiring substrate 10. Anisotropic conductive agent 11 is applied on the leaders of upper and lower panels 1, 5 as well as respective connectors of substrate 10, and upper leaders 3A, 4A are coupled to connectors 12A, 13A of the first principal surface of substrate 10 respectively. Lower leaders 7A, 8A of lower panel 5 are respectively coupled to connectors 14B, 15B disposed on the second principal surface of substrate 10. The conventional optically transparent touch panel is thus formed.

In the foregoing construction, an optically transparent touch panel is mounted on the front face of the display element such as an LCD, and each one of the wiring patterns of wiring substrate 10 is coupled to a detecting circuit (not shown) of an electronic apparatus by connectors. The upper face of upper panel 1, namely, the operation panel, is depressed by a finger or a pen, thereby bowing upper panel 1, and the depressed section of upper conductive layer 2 is brought into contact with lower conductive layer 6. The detecting circuit (not shown) applies voltage across upper electrodes 3, 4 as well as lower electrodes 7, 8, for detecting a resistance ratio of those electrodes, so that the position depressed is detected, and a function of the electronic apparatus can be switched to another function.

However, the conventional wiring substrate and the input device employing the same substrate have required double-sided wiring patterns and through-holes, so that the construction of the wiring substrate becomes complicated, which is accompanied by an increment of the number of manufacturing steps. As a result, the input device is obliged to be expensive.

Prior art of the present invention is disclosed in Japanese Patent Unexamined Publication No. 2003-108302. U.S. Pat. No. 6,304,251 also discloses a flat cable similar to the present invention shown in FIGS. 6 and 7.

SUMMARY OF THE INVENTION

The present invention addresses the problem discussed above and aims to simplify the construction of the wiring substrate and reduce the number of manufacturing steps for providing an inexpensive wiring substrate, an input device using the same wiring substrate, and a method of manufacturing the input device.

To achieve the foregoing objectives, the wiring substrate of the present invention has plural wiring patterns and connectors only on its first principal surface. The wiring substrate also has a flexible bending section, and when the substrate is bent along this bending section, parts of the connectors are disposed to the second principal surface, namely, to the opposite side of the first principal surface. This construction does not require wiring patterns formed on both sides of the substrate as well as through holes, so that the construction of the wiring substrate can be simplified, which reduces the number of manufacturing steps. As a result, an inexpensive wiring substrate can be obtained.

The connector bent is in one-sheet construction, so that all the connectors of the wiring substrate become in a single sheet construction and the thickness thereof is kept uniform. As a result, the electrical and mechanical connections of those connectors to other connecting means can be highly reliable.

The wiring substrate of the present invention includes connectors not bent and placed on the first principal surface, and other connectors bent along the bending section and appearing on the second principal surface. Those two types of connectors are aligned on one straight line. This construction advantageously allows the flexible wiring substrate to be inserted into a given place and to be held by an input device with ease comparing with a construction where plural connectors are not aligned lineally.

The wiring substrate of the present invention includes a narrower section and a wider section, wherein the connectors and the bent section are formed on the wider section. The wiring substrate of the present invention includes a cut formed at a predetermined section.

The wiring substrate of the present invention includes a wider section and a cut, so that connectors can be formed at the wider section and the cut can absorb stress applied to the wiring substrate as well as allows bending the connectors with ease.

The wiring substrate of the present invention includes an adhering section at a given place. The presence of this adhering section allows fixing a location of the wiring substrate after the bending of the connectors at the adhering section, so that the connectors can be advantageously bent with ease.

The wiring substrate of the present invention has holes at given places, and the presence of those holes allows positioning the substrate bent after the bending of the substrate along the bending section. This construction advantageously allows the wiring substrate to be processed with ease and an input device using this wiring substrate to be manufactured with ease comparing with a construction having no such holes.

The input device of the present invention comprises the following elements:
  a wiring substrate;
  an upper panel having an upper conductive layer formed at given places on the whole or parts of its first principal surface, and an upper electrode coupled to the upper conductive layer; and
  a lower panel having a lower conductive layer formed at given places on the whole or parts of its first principal surface and opposing to the upper conductive layer with a given space in between, and a lower electrode coupled to the lower conductive layer.

Plural connectors of the wiring substrate are coupled to the upper and lower electrodes at given places. Since the wiring patterns are formed only on a single surface, and no through holes are needed, the construction of the wiring substrate can be simplified as well as the number of manufacturing steps can be reduced. As a result, an inexpensive wiring substrate is obtainable.

The method of manufacturing the input device of the present invention comprising the steps of:
  bending the wiring substrate along a bending section; then
  coupling plural connectors of the substrate to the upper and lower electrodes at given places.

This method can reduce the number of manufacturing steps, so that an inexpensive input device is obtainable.

The method of manufacturing the input device of the present invention provides an adhering section on the first principal surface of the wiring substrate, and bends the substrate at the adhering section along the bending section. In bending, the method bonds an upper side to a lower side opposing to the upper side of the wiring substrate together. This method allows advantageously manufacturing the wiring substrate with ease.

The method of manufacturing the input device of the present invention provides an adhering section on the first principal surface of the wiring substrate, and bends the substrate at the adhering section along the bending section. In bending, the method bonds an upper side to a lower side opposing to the upper side of the wiring substrate together. This method allows advantageously manufacturing the wiring substrate with ease.

As discussed above, the present invention provides the wiring substrate having a construction simplified, which reduces the number of manufacturing steps, and an input device using the same wiring substrate. The present invention also provides a method of manufacturing this input device.

DETAILED DESCRIPTION OF THE PRESENT INVENTION

Exemplary embodiments of the present invention are demonstrated mainly on an optically transparent touch panel with reference to FIG. 1–FIG. 6. Elements similar to what have been described in the background of the invention have the same reference marks, and the detailed descriptions thereof are omitted here.

Exemplary Embodiment 1

Figure 1:
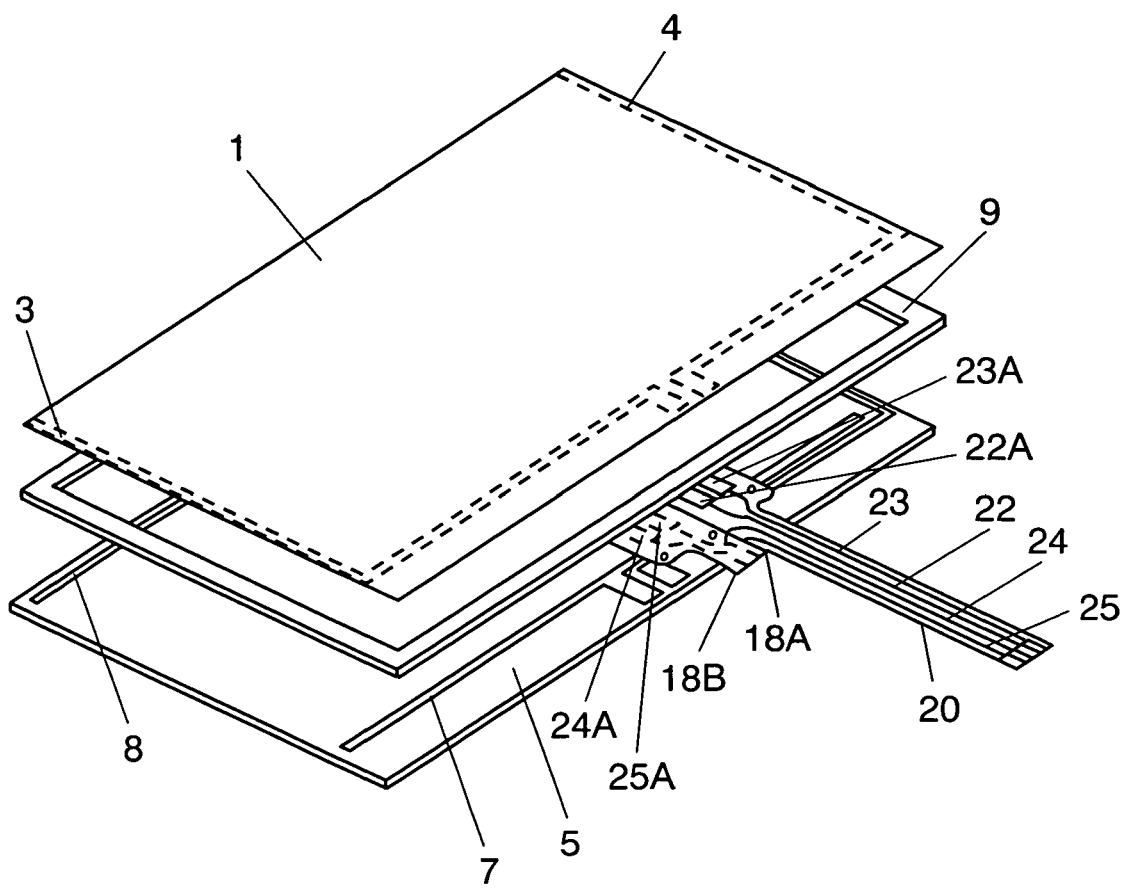
FIG. 1 shows an exploded perspective view of an optically transparent touch panel in accordance with an exemplary embodiment of the present invention.

An optically transparent touch panel of the present invention is demonstrated with reference to FIG. 1–FIG. 3. Optically transparent upper panel 1 made from polyethylene-terephtalate or polycarbonate film has optically transparent upper conductive layer 2 made of indium oxide or tin oxide on its first principal surface. Upper conductive layer 2 is formed by a vacuum sputtering method.

Figure 2A:
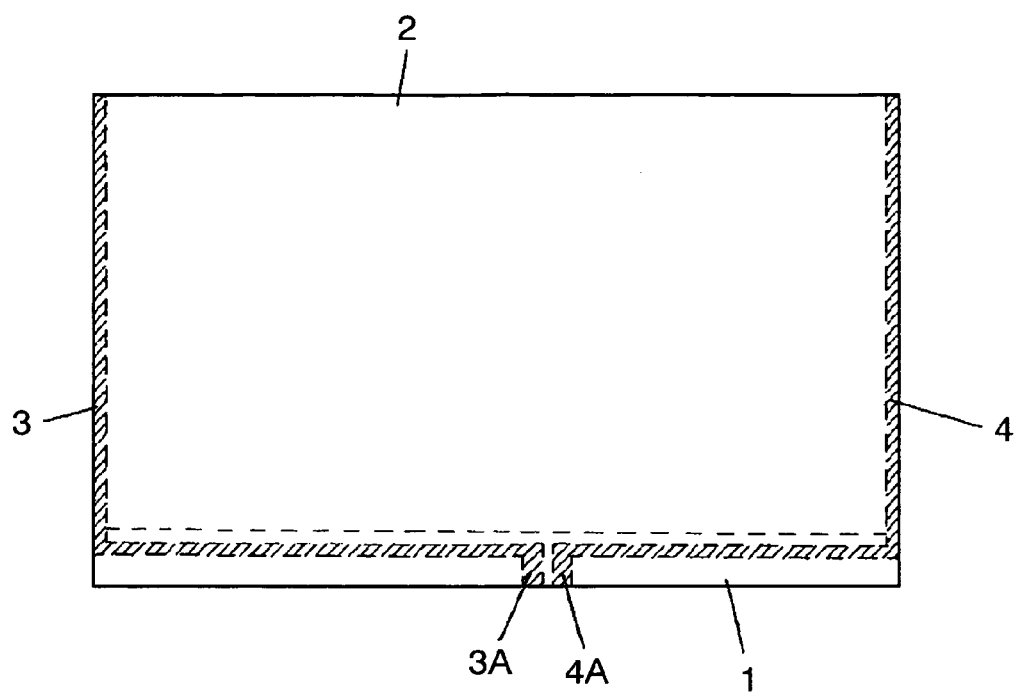
FIG. 2A shows a plan view of an upper panel of the present invention.

As shown in FIG. 2A, upper conductive layer 2 is removed by etching or laser cutting in a given pattern, so that the base of upper panel 1 is exposed, and a pair of upper electrodes 3, 4 are formed by printing the paste made from silver or carbon on the exposed area. Upper leaders 3A, 4A are formed on the exposed area of upper panel 1.

Figure 2B:
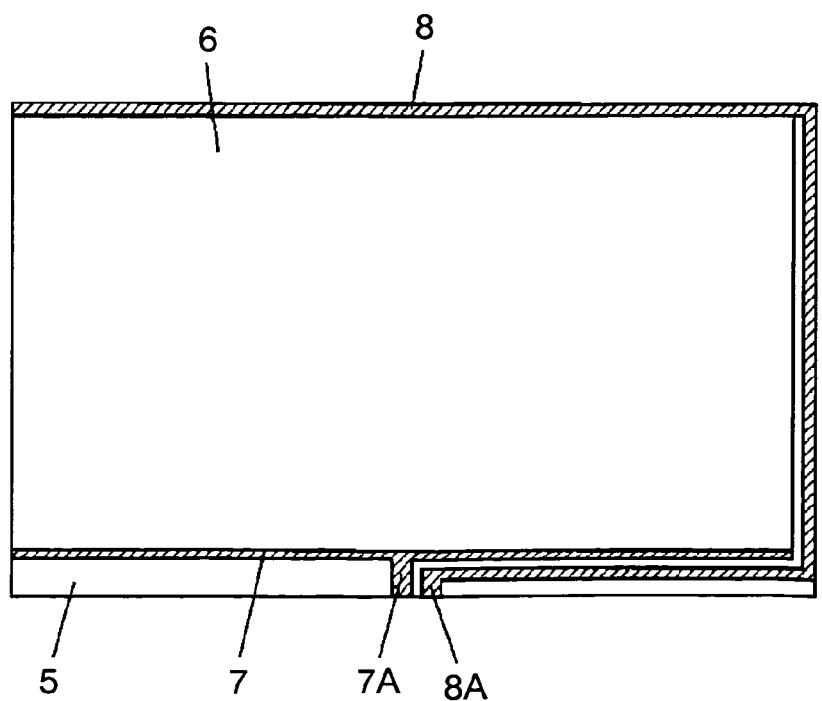
FIG. 2B shows a plan view of a lower panel of the present invention.

Lower panel 5 made from glass, acrylic, or polycarbonate resin has lower conductive layer 6 having transparency like upper conductive layer 2. As shown in FIG. 2B, a pair of lower electrodes 7, 8 are formed on lower panel 5 at placeslayer 6 is removed.

Lower electrodes 7, 8 have a pair of lower leaders 7A, 8A at their ends respectively. Lower conductive layer 6 has plural dot-spacers (not shown) on its upper face for maintaining a given space between upper conductive layer 2 and lower conductive layer 6. The dot spacers are formed at given intervals and made from insulating resin such as epoxy or silicon.

As shown in FIG. 1, upper and lower panels 1 and 2 are bonded at their circumferences by frame-like spacer 9, on which upper and lower faces adhesive is applied, so that upper and lower conductive layers 2, 6 can oppose to each other with a given space maintained. Between the leaders of upper and lower panels 1 and 5, plural wiring patterns and connectors are formed on a first principal surface of wiring substrate 20, and flexible bending section P—P (cf. FIG. 3) is formed. When wiring substrate 20 is bent along the bending section P—P, parts of connectors appear on a second principal surface of substrate 20 and are located between upper panel 1 and lower panel 5. (47)As shown in FIG. 1, holes 18A, 18B are punched on substrate 20 for bending a part of substrate 20. An advantage of those holes is described later.

Figure 3A:
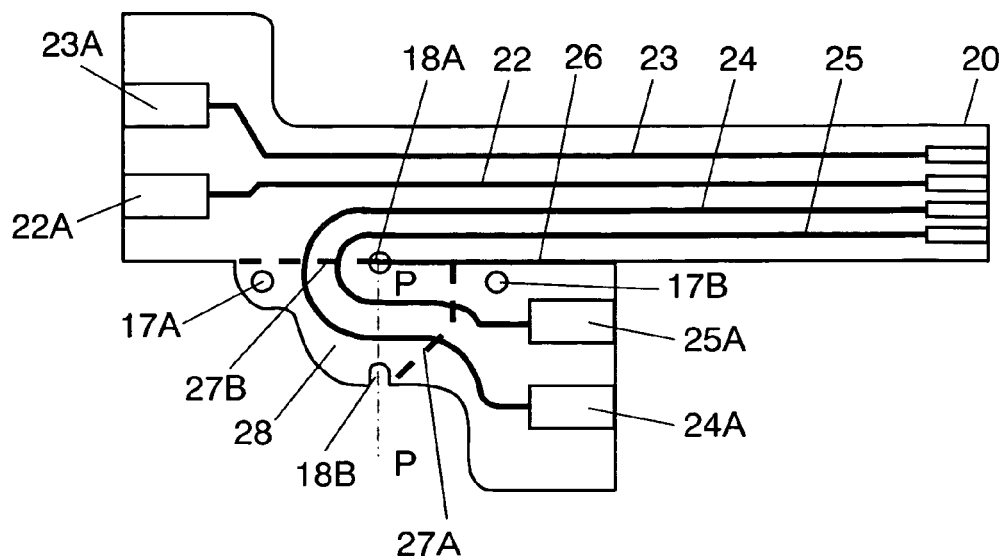
FIG. 3A shows a plan view of a wiring substrate in accordance with an exemplary embodiment of the present invention.

Wiring substrate 20 shown in FIG. 3A includes a narrower section, a first wider section, and a second wider section. The narrower section occupies an area from the right side up to approx. the center of FIG. 3A. A first principal surface of this narrower section has wiring patterns 22, 23, 24, and 25. The ends of patterns 22, 23 are respectively coupled to connectors 22A, 23A formed on the first wider section. Patterns 24, 25 make turnaround at the vicinity of the first wider section, and are coupled respectively to connectors 24A, 25A provided to the second wider section, i.e. the center section of substrate 20.

Hole 17A are punched on parts of the first wider section, and hole 17B are provided to the second wider section. Holes 18A, 18B are provided at an intermediate section between the end of the first wider section and the end of the second wider section. Holes 17A, 17B are used when wiring substrate 20 undergoes some treatment or a step of positioning, or is brought to the next step. The line between holes 18A and 18B corresponds with flexible bending section P—P.

Cut 26 is made between wiring pattern 26 and hole 17B, and cut 26 runs from an end of the second wider section to hole 18A, and crosses with bending section P—P nearly at right angles. A position and a length of the bending section are determined depending on a shape of the wiring substrate or leaders of connectors. An area surrounded by line 27A and line 27B works as adhering section 28.

Figure 3B:
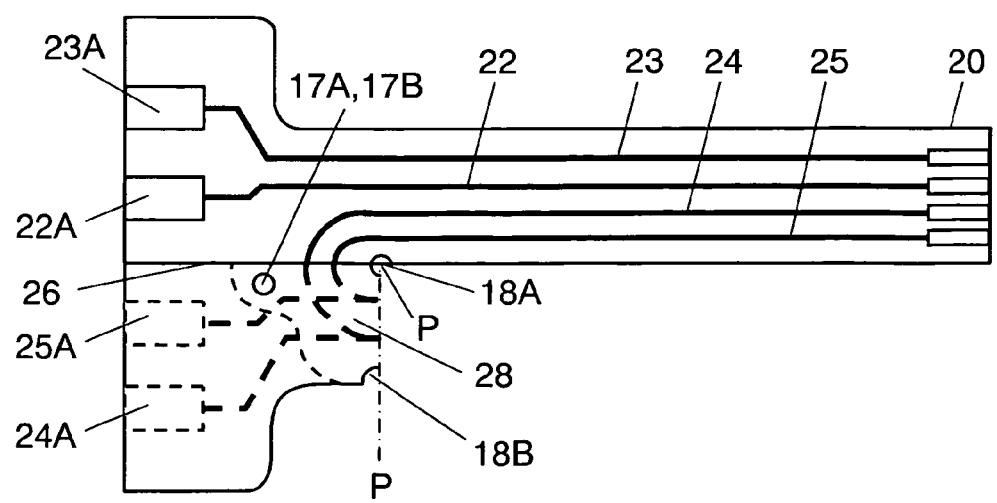
FIG. 3B shows a plan view of the wiring substrate, shown in FIG. 3A, bent along a bending section.

FIG. 3B shows a state of wiring substrate 20 bent along bending section P—P shown in FIG. 3A. In bending substrate 20, a bending jig (not shown) equipped with three positioning pins is used. Substrate 20 is bent such that a positioning pin runs through holes 17A and 17B, in other words, substrate 20 is bent at bending section P—P, which connects respective centers of holes 18A and 18B, such that hole 17A is overlaid on and agrees with hole 17B.

Substrate 20 is bent along bending section P—P such that connectors 24A, 25A are aligned with connectors 22A, 23A. After the bending, connectors 22A and 23A remain on the first principal surface of substrate 20, however, connectors 24A and 25A are turned to appear on the second principal surface. The area where those four connectors are placed is kept as a single sheet, so that the area can be kept at the same thickness.

In order to fix the overlaid sections to each other, an area surrounded by line 27A and line 27B is used as adhering section 28, so that adhesive or adhesive tape is applied to section 28.

Figure 4:
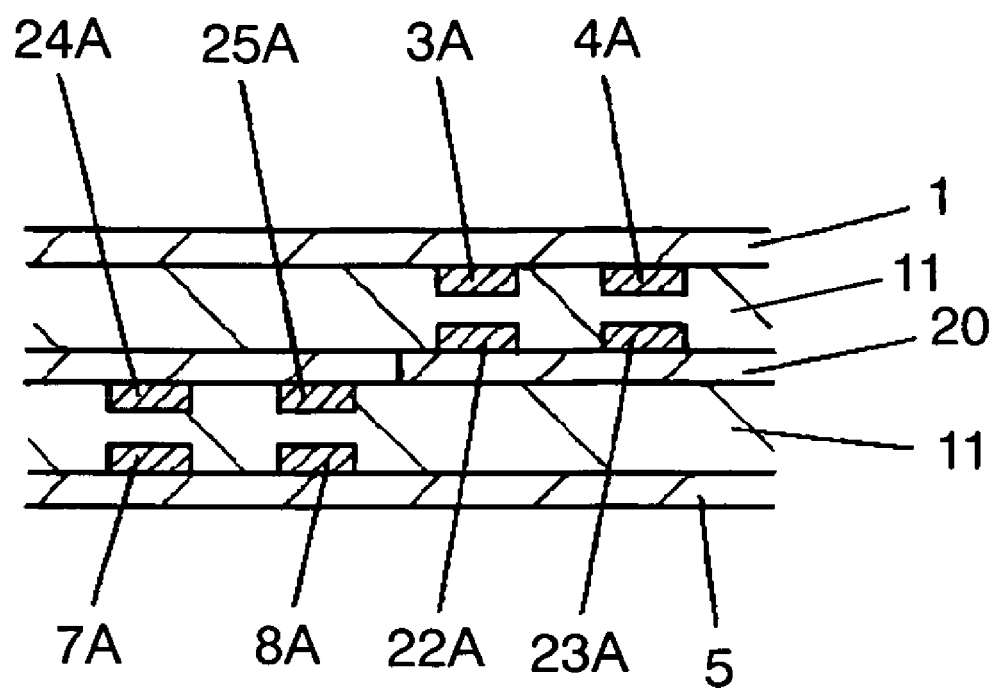
FIG. 4 shows a sectional view illustrating an instance where the substrate shown in FIG. 3B is integrated into a touch panel.

FIG. 4 shows a sectional view illustrating wiring substrate 20 integrated into a touch panel. Anisotropic conductive adhesive 11 is applied between the respective leaders of upper and lower panel 1, 5 and the respective connectors of substrate 20. Instead of applying adhesive 11 directly there, anisotropic conductive tape CP7131 made by Sony Chemical Inc. with anisotropic conductive adhesive applied thereon can be stuck there. Upper leaders 3A, 4A of upper panel 1 are bonded and connected to connectors 22A, 23A of substrate 20. Lower leaders 7A, 8A of lower panel 5 are bonded and connected to connectors 24A, 25A on the left side of substrate 20. An optically transparent touch panel is thus constructed.

The touch panel discussed above is mounted on a front face of a display element such as an LCD, and each one of the wiring patterns of wiring substrate 20 is coupled via connectors to the detecting circuit of the electronic apparatus.

When an upper face of upper panel 1 is depressed with a finger or a pen, i.e. an operation panel is depressed, upper panel 1 is bowed, and upper conductive layer at the bowed place comes into contact with lower conductive layer 6. Then the detecting circuit applies a voltage across upper electrodes 3, 4 as well as lower electrodes 7, 8 for detecting a resistance ratio of those electrodes, thereby detecting a location of the place detected and switching a function of the electronic apparatus to another function.

As discussed above, the first exemplary embodiment features that plural wiring patterns 22, 23, 24 and 25, connectors 22A, 23A, 24A and 25A are formed only on the first principal surface of wiring substrate 20.

When substrate 20 is bent along flexible bending section P—P, parts of the connectors, namely, connectors 24A, 25A in this embodiment, are turned to appear on the second principal surface of substrate 20. As a result, wiring patterns on both the surfaces of substrate 20 and through-holes are not needed, which simplifies the construction and does not increase the number of manufacturing steps. An inexpensive wiring substrate 20 is thus obtainable.

Preparing holes 17A,17B for positioning connectors 22A, 23A, 24A and 25A after the bending allows using a bending jig equipped with positioning pins, and the jig can produce the following advantage: After the bending, the positioning pins run through holes 17A, 17B, so that connectors 22A, 23A, 24A and 25A can oppose to upper leaders 3A, 4A, and lower leaders 7A, 8A as given places of upper electrodes 3, 4 and lower electrodes 7, 8. Thus the presence of the holes allows speed-up of the assembly work without increasing the number of manufacturing steps.

Connectors 22A, 23A, 24A and 25A of wiring substrate 20 are coupled to the predetermined sections of upper electrodes 3, 4 and lower electrodes 7, 8, namely, upper leaders 3A, 4A and lower leaders 7A, 8A, so that the input device is constructed. As a result, wiring patterns on both the surfaces of substrate 20 and through-holes are not needed, which simplifies the construction and does not increase the number of manufacturing steps. An inexpensive wiring substrate 20 and the method of manufacturing the input device are thus obtainable.

In the foregoing description, it is explained that the optically transparent touch panel is formed of upper panel 1 and lower panel 5 of which entire or parts of the surfaces include thereon upper and lower conductive layers 2, 6 made from indium tin oxide or tin oxide. However, instead of this construction, upper and lower conductive layers 2, 6 can be printed with paste such as silver or carbon of non-transparence like upper electrodes 3, 4 or lower electrodes 7, 8.

The upper conductive layer is formed on the first principal surface of upper panel 1 at a given place, and the lower conductive layer is formed on the first principal surface of lower panel 5 at given place. A depression applied to the upper face of upper panel 1 brings a given place of the upper conductive layer into electrical contact with only the lower conductive layer. This construction allows forming an input device such as a membrane switch.

Exemplary Embodiment 2

Figure 5A:
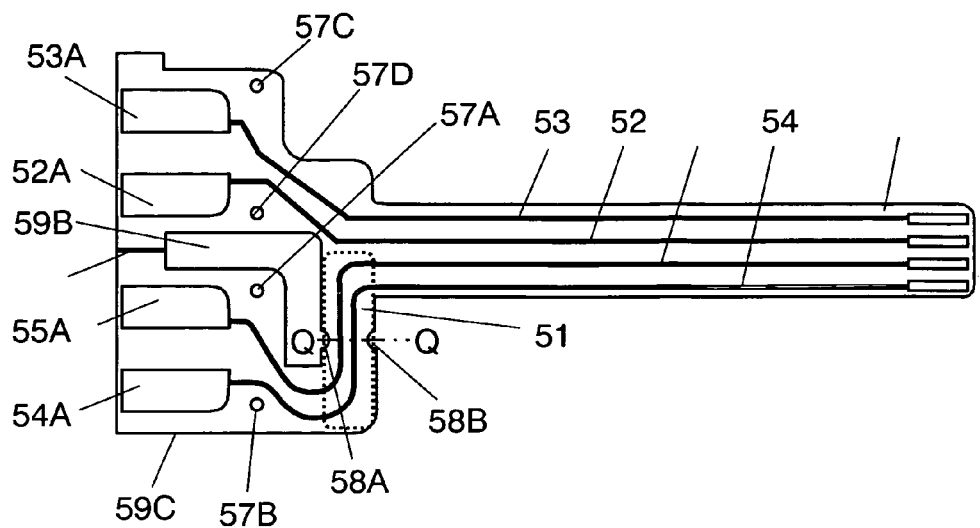
FIG. 5A shows a plan view of a wiring substrate in accordance with another exemplary embodiment of the present invention.
Figure 5B:
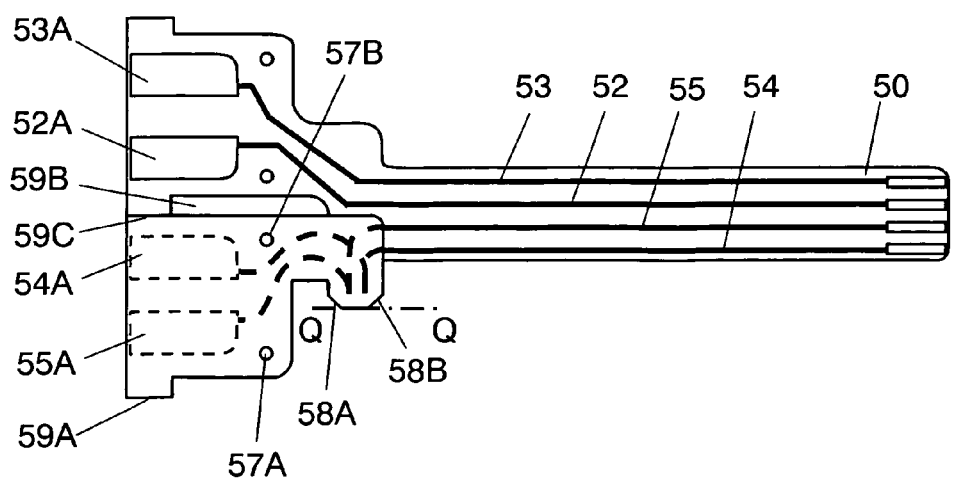
FIG. 5B a plan view of the wiring substrate, shown in FIG. 5A, bent along a bending section.

FIG. 5A and FIG. 5B show plan views of a wiring substrate in accordance with the second exemplary embodiment. The material and construction of this wiring substrate remain unchanged from those of the first exemplary embodiment, so that detailed descriptions thereof are omitted here. The substrate of the second embodiment differs from that of the first embodiment in a shape of the substrate.

Wiring substrate 50 shown in FIG. 5A includes a narrower section and a wider section as the wiring substrate shown in FIG. 3A does. At the narrower section, wiring patterns 52, 53, 54 and 55 are formed independently, and respective ends of those patterns are coupled to connectors 52A, 53A, 54A and 55A formed at the wider section disposed on the left side in FIG. 5A.

Bending section Q—Q is prepared at a part of the wider section, and both the ends of bending section Q Q have corner-cuts 58A, 58B, which have substantially semicircular shape, define bending section Q—Q clearly and also facilitate the bending of the substrate.

Cut 59A is provided at an intermediate section between connectors 52A and 55A, in other words, cut 59A is formed approx. at the center of the wider section for bending the wider section of substrate 50. After the bending, cut 59A appears as a projection outside the wider section as shown in FIG. 5B.

Slit 59B is provided connecting to cut 59A primarily for defining a bending place and its location and secondarily for moderating stress occurring at the heat treatment or the bending.

As shown in FIG. 3A, bending section P—P of the first embodiment crosses with an extending direction of the narrower section of substrate 20 at right angles; however, in the second embodiment, bending section Q—Q is situated approx. in parallel with the extending direction of the narrower section. As discussed in the first embodiment, a position and a length of the bending section are determined depending on a shape of the wiring substrate or leaders of the connectors.

Adhering section 51 is prepared around bending section Q—Q to be an approx. center. In order to fix the overlaid sections bent along bending section Q—Q to each other, adhesive or adhesive tape is applied to adhering section 51. Reference mark 59C indicates a side of the wider section of substrate 50.

FIG. 5B shows a status after substrate 50 is bent along bending section Q—Q shown in FIG. 5A. Substrate 50 is bent such that the positional relation between cut 59A and side 59C is reversed, which is accompanied by the reversal of the positional relation between holes 57A and 57B. The projection formed by cut 59A and slit 59B appears outside the wider section after the bending.

Connectors 53A, 52A, 54A and 55A of substrate 50 after the bending are aligned on a straight line and they are placed on a single substrate, i.e. no doubled area is available for the connectors. As a result, substrate 50 of a single sheet construction is obtainable, in other words, the thickness of substrate 50 is kept uniform, so that the electrical and mechanical connections of those connectors to other connecting means can be highly reliable.

Wiring substrate 50 shown in FIG. 5B can be used in a touch panel instead of wiring substrate 20 shown in FIGS. 3, 4.

Meanwhile substrate 50 can be bent along bending section Q—Q connecting the centers of round corner-cuts 58A and 58B such that the positional relation between holes 57A and 57B is reversed, and connectors 54A, 55A are placed at a lower place of connectors 52A, 53A formed on the first principal surface at the left side of substrate 50.

Exemplary Embodiment 3

Figure 6A:
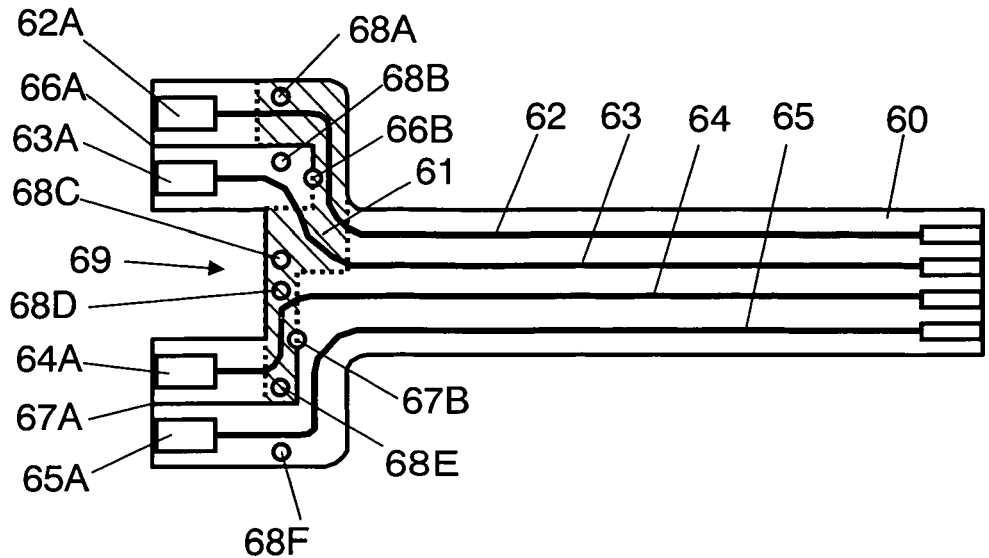
FIG. 6A shows a plan view of a wiring substrate in accordance with still another exemplary embodiment of the present invention.
Figure 6B:
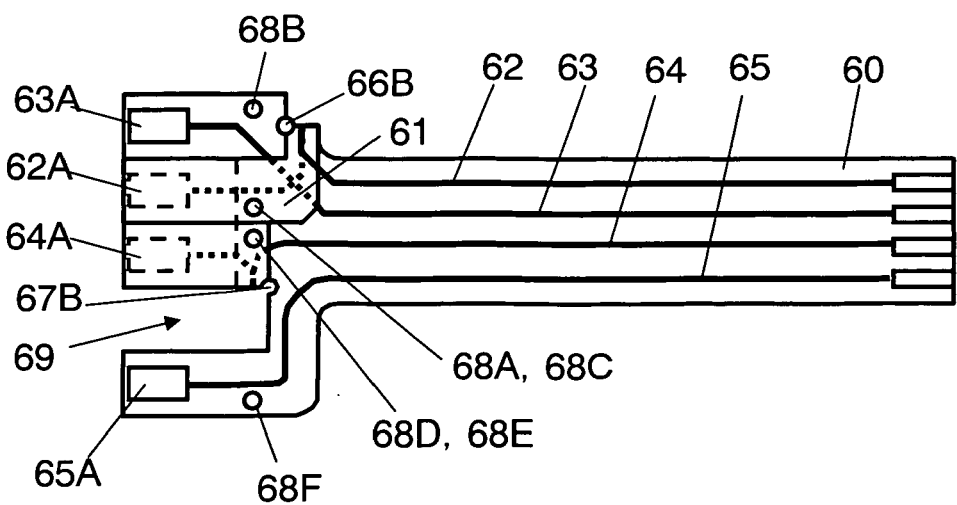
FIG. 6B shows a plan view of the wiring substrate, shown in FIG. 6A, bent along a bending section.
Figure 7:
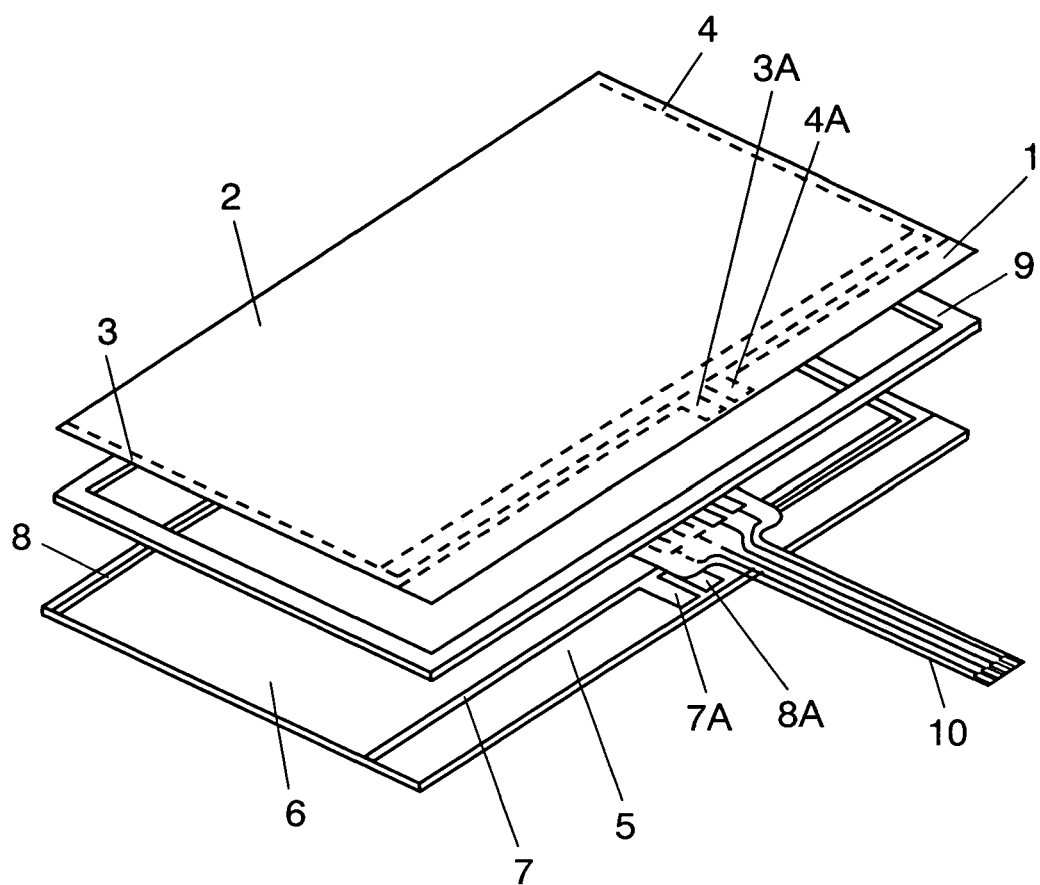
FIG. 7 shows an exploded perspective view of a conventional optically transparent touch panel.
Figure 8:
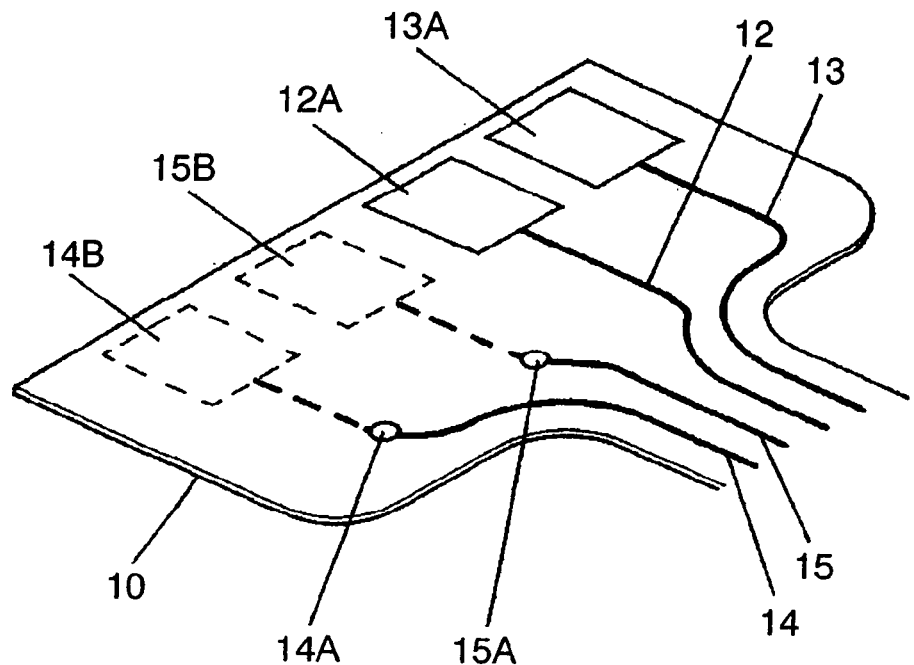
FIG. 8 shows a perspective view illustrating an essential part of a wiring substrate used in the conventional touch panel.
Figure 9:
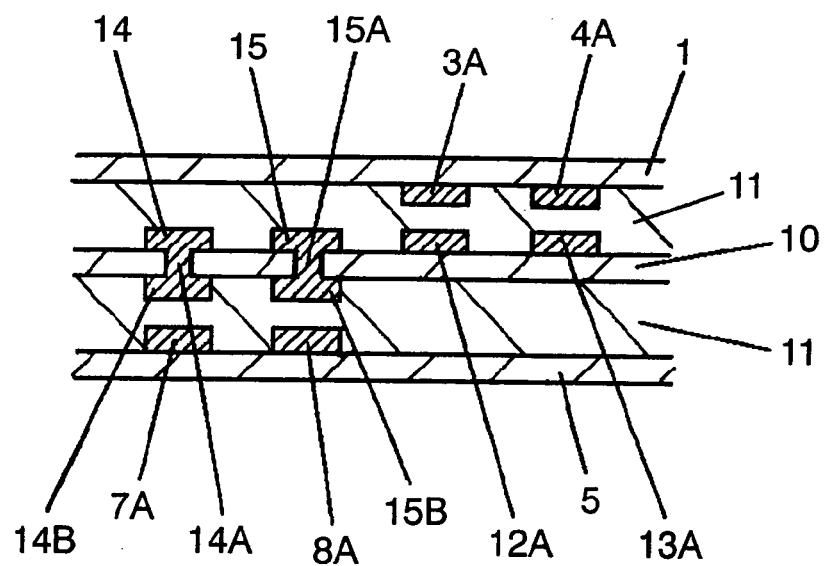
FIG. 9 shows a sectional view of a conventional wiring substrate.

FIGS. 6A and 6B show plan views of a wiring substrate in accordance with the third exemplary embodiment. The material and construction of this wiring substrate remain unchanged from those of the first and second exemplary embodiments, so that detailed descriptions thereof are omitted here. The substrate of this third embodiment differs from those of the first and second embodiments in a shape of the substrate.

Wiring substrate 60 shown in FIG. 6A includes a narrower section and a wider section as wiring substrate 20 shown in FIG. 3A does. At the narrower section, wiring patterns 62, 63, 64 and 65 are formed independently, and respective ends of those patterns are coupled to connectors 62A, 63A, 64A and 65A formed at the wider section disposed on the left side in FIG. 6A.

Cut 66A is prepared for separating connector 62A from connector 63A, and placed in parallel with those connectors.

Cut 66A turns downward at approx. a right angle at an intermediate place of the wider section, and then runs to hole 66B. Cut 67A is prepared for separating connector 64A from connector 65A, and is disposed in parallel with those connectors. Cut 67A turns upward at approx. a right angle at an intermediate place of the wider section, and then runs to hole 67B. Those two cuts 66A and 67A are disposed in parallel with an extending direction of the narrower section of wiring substrate 60. When cuts 66A and 67A are prepared, the location and dimensions thereof are determined depending on the shape of the wiring substrate and the leaders of the connectors.

Cuts 66A and 67A correspond to the bending section described in the first and the second embodiments. This third embodiment prepares two cuts, which differ from the first and second ones in preparing a single cut respectively.

Holes 68A–68F are provided at given places of the wider section of substrate 60. Those holes are used for indexing positions in bending. Notch 69 is prepared by cutting a rather wide area at approx. center of the wider section. The presence of notch 69 facilitates the bending work along cuts 66A, 67A. Notch 69 has a given shape and a size so that it can receive the folded-over section of the wiring substrate. The wider section includes adhering section 61 at which overlapped sections due to the bending of substrate 60 are bonded, so that adhesive or adhesive tape is applied to this adhering section 61.

Notch 69 has a secondary advantage of absorbing stress produced when substrate 60 undergoes heat treatment or pressurizing treatment.

FIG. 6B shows a state after substrate 60 is folded along cuts 66A, 67A shown in FIG. 6A, namely, the state after substrate 60 has undergone the fold-over twice. The first fold-over is this: the section in which connector 62A and hole 68A are formed is folded over this side along the line between cut 66A and hole 66B toward notch 69. The second fold-over is this: the section in which connector 64 and hole 68E are formed is folded over that side along the line between cut 67A and hole 67B toward notch 69.

After the fold-over twice as discussed above, hole 68A overlaps and agrees with hole 68C, and hole 68D overlaps and agrees with hole 68E, and the positional relation between connectors 62A and 63A is reversed.

Connectors 63A, 62A, 64A and 65A are aligned on one straight line, and they do not overlap with each other, so that wiring substrate 60 in one-sheet construction is obtainable. Since at least the connectors of substrate 60 are formed in one-sheet construction, those connectors can be coupled with other connectors mechanically or electrically with higher reliability.

Wiring substrate 60 shown in FIG. 6B can be used in a touch panel instead of wiring substrate 20 shown in FIG. 4.

When wiring substrate 60 shown in FIG. 6B is used as a part of a touch panel, connectors 62A, 63A, 64A and 65A can be placed arbitrarily comparing with wiring substrate 20 shown in FIG. 3B. As a result, a degree of freedom in designing increases.

INDUSTRIAL APPLICABILITY

The present invention provides a wiring substrate, an input device using the same wiring substrate, and a method of manufacturing the input device for simplifying a construction of the wiring substrate as well as reducing the number of manufacturing steps. The present invention also makes all the connectors of the wiring substrate in a single-sheet construction, so that the connectors to an upper panel and an lower panel can deal flexibly with relative positional variations due to thermal expansion or moisture-absorption expansion. As a result, the electrical and mechanical connections of those connectors of the wiring substrate to other connecting means can be highly reliable, and the input device using the same wiring substrate as well as the method of manufacturing the same input device is obtainable. The present invention is thus useful for an input device, such as an optically transparent touch panel, to be used for operating a variety of electronic apparatuses, and for manufacturing the input device.

What is claimed is:

1. A flexible wiring substrate having a plurality of wiring patterns, which includes connectors, formed on a first principal surface, the substrate comprising:
   at least one bending section at a given place on the wiring patterns,
   wherein at least one connector bent along the bending section is placed on a second principal surface opposite to the first principal surface, and the wiring substrate is in one-sheet construction such that the at least one connector does not overlap another connector.

2. The wiring substrate of claim 1, wherein a connector not bent and disposed on the first principal surface and another connector bent and appearing on the second principal surface are arranged laterally with respect to each other.

3. The wiring substrate of claim 1 further comprising a narrower section and a wider section, wherein the connectors and the bent section are formed on the wider section.

4. The wiring substrate of claim 2, wherein the substrate has a cut formed at a predetermined section.

5. The wiring substrate of claim 2, wherein the substrate has an adhering section at a predetermined section.

6. The wiring substrate of claim 2, wherein the substrate has a hole at a predetermined section.

7. An input device comprising:
   the wiring substrate as defined in claim 1;
   an upper panel, of which first principal surface has an upper conductive layer and an upper electrode coupled to the upper conductive layer on an entire or a part of a first principal surface of the upper panel; and
   a lower panel, of which first principal surface has a lower conductive layer and an lower electrode coupled to the lower conductive layer on an entire or a part of a first principal surface of the lower panel, the lower conductive layer opposing to the upper conductive layer with a given space in between,
   wherein the connectors of the wiring substrate are coupled to given places of the upper electrode and the lower electrode.

8. The method of manufacturing the input device of claim 7, the method further comprising the step of:
   bonding the adhering sections of the upper panel and the lower panel respectively after bending the wiring substrate along the bending section.

9. The method of claim 7, wherein an adhering section is disposed on the first principal surface of the wiring substrate, and an upper side is bonded to a lower side opposing to the upper side of the substrate together in bending the substrate at the adhering section along a bending section.

* * * * *